(12) United States Patent
Li

(10) Patent No.: US 11,159,098 B2
(45) Date of Patent: Oct. 26, 2021

(54) METHOD AND HALF BRIDGE CONTROLLER FOR DETERMINING A POLARITY OF A HALF BRIDGE CURRENT

(71) Applicant: Infineon Technologies AG, Neubiberg (DE)

(72) Inventor: Tao Li, Shenzhen (CN)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/841,066

(22) Filed: Apr. 6, 2020

(65) Prior Publication Data

US 2020/0321890 A1 Oct. 8, 2020

(30) Foreign Application Priority Data

Apr. 5, 2019 (WO) ............... PCT/CN2019/081629
May 29, 2019 (DE) ......................... 102019114507.4

(51) Int. Cl.
*H02M 7/5387* (2007.01)
*H02M 1/12* (2006.01)
*H03K 17/284* (2006.01)
*H02M 1/00* (2006.01)

(52) U.S. Cl.
CPC ......... *H02M 7/53873* (2013.01); *H02M 1/12* (2013.01); *H03K 17/284* (2013.01); *H02M 1/0009* (2021.05)

(58) Field of Classification Search
CPC ........... H02M 7/5387; H02M 7/53871; H02M 7/53873; H02M 2/23; H02M 2001/0009; H03K 17/28; H03K 17/284
See application file for complete search history.

(56) References Cited

U.S. PATENT DOCUMENTS

| 5,268,830 A | 12/1993 | Loftus, Jr. |
| 5,550,450 A | 8/1996 | Palko et al. |
| 5,850,132 A | 12/1998 | Garces |
| 2014/0078787 A1 | 3/2014 | Sonobe |
| 2015/0357915 A1 | 12/2015 | Kim |
| 2016/0308524 A1* | 10/2016 | Inoue .................. H01L 29/0619 |
| 2018/0301999 A1 | 10/2018 | Moon et al. |

FOREIGN PATENT DOCUMENTS

| CN | 107681883 A | 2/2018 |
| DE | 102011056493 A1 | 8/2012 |
| EP | 1197757 A2 | 4/2002 |
| GB | 2238189 A | 5/1991 |

(Continued)

OTHER PUBLICATIONS

Leggate, D., et al., "Pulse-based dead-time compensator for PWM voltage inverters", Proceedings of IECON '95—21st Annual Conference on IEEE Industrial Electronics, Nov. 6-10, 1995, 8 pages.

(Continued)

*Primary Examiner* — Diana J. Cheng
(74) *Attorney, Agent, or Firm* — Slater Matsil, LLP

(57) ABSTRACT

Methods and half bridge controllers for detecting a polarity of a current through a half bridge are provided. A switching delay of a switch of the half bridge is determined, and a polarity of a current through the half bridge is determined based on the switching delay.

20 Claims, 15 Drawing Sheets

(56) References Cited

FOREIGN PATENT DOCUMENTS

JP        H03112391 A     5/1991
JP        H0698556 A      4/1994

OTHER PUBLICATIONS

Munoz, A. R., et al., "On-line dead-time compensation technique for open-loop PWM-VSI drives", IEEE Transactions on Power Electronics, vol. 14, Issue 4, Jul. 1999, pp. 683-689.

Infineon Technologies AG, "Microcontroller with LIN and BLDG MOSFET Driver for Automotive Applications", BE-/BF-Step, Infineon, User's Manual TLE987X, 907 pages, Feb. 19, 2020.

Zhang, Zhendong et al., "Dead-Time Compensation of Inverters Considering Snubber and Parasitic Capacitance", IEEE Transactions on Power Electronics, vol. 28, Issue 6, Jun. 2014, pp. 3179-3187.

* cited by examiner

METHOD AND HALF BRIDGE CONTROLLER FOR DETERMINING A POLARITY OF A HALF BRIDGE CURRENT

This application claims priority to German Patent Application No. 102019114507.4, filed on May 29, 2019, which application claims the benefit of International Application No. CN2019/081629, which applications are hereby incorporated herein in their entirety by reference.

TECHNICAL FIELD

The present application relates to a method for determining a polarity of a current through a half bridge, a corresponding half bridge controller, as well as to methods and half bridge controllers for dead time compensation used for the half bridge, based on the determined polarity.

BACKGROUND

Half bridges are used in many applications to selectively provide power to a load. Applications include the driving of motors with so-called three phase inverters, where three of such half bridges are used to provide a three phase output current. Half bridges usually comprise a first switch coupled between a first potential and an output node of the half bridge and a second switch coupled between a second potential and the output node. The first potential may be a positive supply voltage, for example, and the second potential may be a negative supply voltage or ground. The first switch is usually referred to as high-side switch, and the second switch is referred to as low-side switch.

In operation of such half bridges, the first and second switches are alternatingly closed and opened to selectively couple the output node either to the first potential or to the second potential.

In such half bridges, if both the first switch and the second switch were closed at the same time, a short circuit between the first potential and the second potential would result. To prevent such a short circuit, so-called dead times are inserted where both switches are open before one of the switches is closed.

However, through these dead times, an output voltage of the half bridge, when for example controlled by a pulse width modulation (PWM) scheme, as common in many applications, deviates from an ideal output voltage, which may introduce current ripples and add non-linearities to a system using the half bridge. The distortion of the output voltage in case for example of an ideal sinusoidal voltage comprises both low frequency harmonics and switching frequency harmonics. The low frequency harmonics may cause a negative impact on the performance of some applications of half bridges.

Various approaches have been used to compensate the effects brought about by the introduction of dead times, which is referred to as dead time compensation herein. Some of these techniques apply a compensation voltage based on a polarity of a current through the half bridge, the polarity indicating if the current flows from the half bridge to a load or from the load to the half bridge. However, with detection circuits conventionally used for determining the polarity, errors may occur when the current is close to zero, as noise may cause a detection of the wrong polarity. Increasing the reliability of these conventional detection circuits requires additional hardware or increases the complexity of software for example for filtering algorithms. Also, in other situations, it may be desirable to determine the polarity of a current through a half bridge.

SUMMARY

According to an embodiment, a method for determining a polarity of a current through a half bridge is provided, comprising determining a switching delay of at least one of a high-side switch or a low-side switch of the half bridge, and determining a polarity of a current through the half bridge based on the switching delay.

According to another embodiment, a half bridge controller is provided, comprising a measurement circuit configured to determine a switching delay of at least one of a high-side switch or a low-side switch of the half bridge, and a control circuit configured to determine a polarity of a current through the half bridge based on the switching delay.

The above summary is merely intended to give a brief overview over some features of some embodiments and is not to be construed as limiting in any way.

DETAILED DESCRIPTION OF ILLUSTRATIVE EMBODIMENTS

Figure 1:
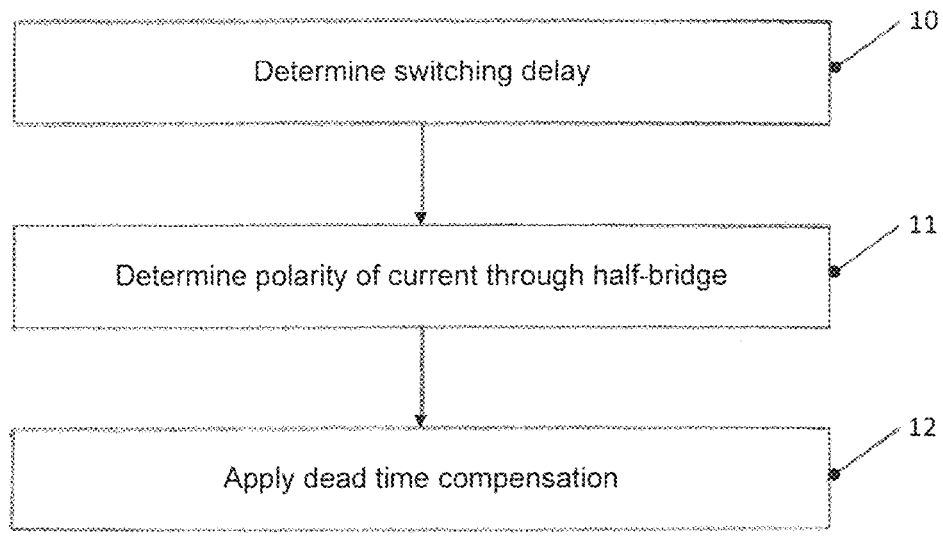
FIG. 1 is a flowchart illustrating a method according to an embodiment.

In the following, various embodiments will be described in detail referring to the attached drawings. While various details are shown in the drawings and described in the corresponding description, this is not to be construed as indicating that all those details are required for implementation of embodiments. In other embodiments, some of these details may be omitted or may be replaced by alternative features or details.

Furthermore, in addition to the features or details explicitly described, other features may be provided, for example features conventionally provided in half bridge circuits, controllers for half bridge circuits and applications of such half bridge circuits.

Features from different embodiments may be combined to form further embodiments. Variations and modifications described with respect to one of the embodiments are also applicable to other embodiments unless explicitly noted otherwise. Variations and modifications described with respect to one of the embodiments are also applicable to other embodiments unless noted otherwise and will therefore not be described repeatedly.

Connections or couplings shown in the drawings or described herein relate to electrical connections or coupling and/or to connections or couplings for transmitting signals within a circuit or logic entity unless noted otherwise.

Embodiments discussed herein in the following relate to determining a polarity of a current through a half bridge. The polarity of the current indicates if the current flows from the half bridge towards a load coupled to the half bridge or from the load to the half bridge.

Half bridges as described herein contain switches. A switch may comprise a control terminal and two load terminals. The state of the switch may be controlled by applying a signal to the control terminal. The state of the switch is referred to as closed or on, e.g. switched on, if the switch provides a low-ohmic electrical path between its load terminals. The switch is referred to as open or off, e.g. switched off, if the switch is essentially electrically isolating between its load terminals. "Essentially electrically isolating" refers to the fact that in real switch implementations some parasitic leakage currents may occur between the load terminals even in the open state. However, such leakage currents, if they occur, are usually several orders of magnitude lower than currents flowing when the switch is in a closed state.

Switches may be implemented using transistors. Usable transistors include field effect transistors like MOSFETs (metal oxide semiconductor field effect transistors), bipolar transistors or insulated gate bipolar transistors (IGBTs). In case of field effect transistors, the control terminal corresponds to the gate terminal, and the load terminals correspond to the source and drain terminals. In case of bipolar transistors, the control terminal corresponds to the base terminal, and the load terminals correspond to the emitter and collector terminals. In case of IGBTs, the control terminal corresponds to the gate terminal, and the load terminals correspond to the collector and emitter terminals. In many implementations of half bridges, such switches based on transistors also comprise a freewheeling diode between the load terminals. The freewheeling diode may be intrinsic to the respective transistor design or may be provided separately.

FIG. 1 illustrates a method according to an embodiment. The method may be implemented for example in a half bridge controller.

At 10, the method of FIG. 1 comprises determining a switching delay of a switch of the half bridge. As explained in the background section, a half bridge contains a first switch and a second switch, also referred to as high-side switch and low-side switch. A switching delay as used herein relates to a delay between a control signal for changing the state of the switch from open to closed or from closed to open and vice versa and the actual change of the state of the switch.

At 11, the method comprises determining a polarity of a current through the half bridge based on the switching delay. For example, determining the polarity may comprise comparing the switching delay to a threshold. Examples for suitable thresholds will be discussed further below.

In some applications, then a dead time compensation may be applied based on the determined polarity at 12 in FIG. 1.

Possible implementation details of various acts or events of the method of FIG. 1 will be explained further below.

Figure 2:
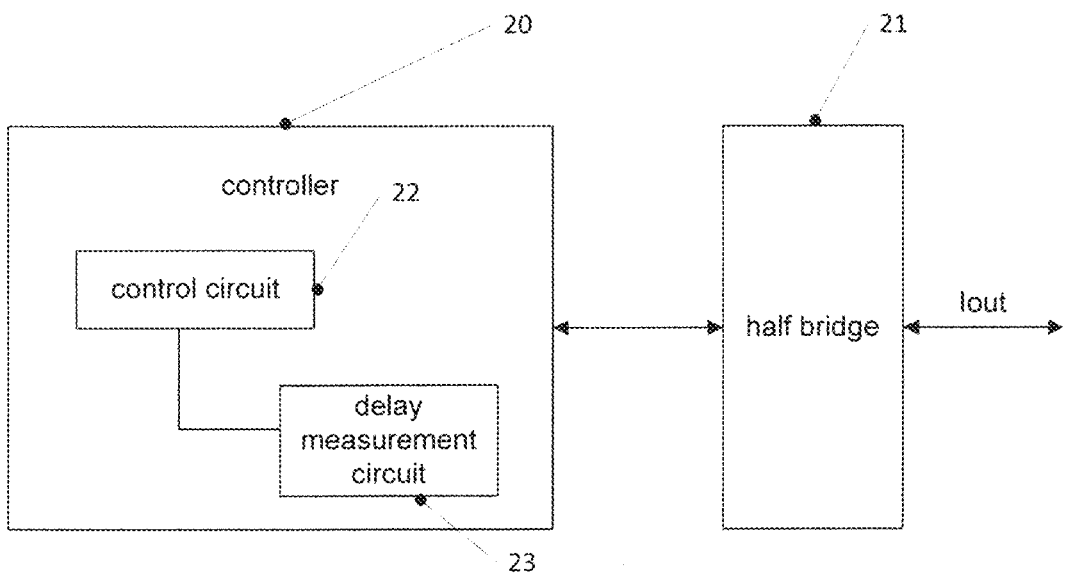
FIG. 2 is a block diagram illustrating a system according to an embodiment.

FIG. 2 illustrates a system according to an embodiment. The system of FIG. 2 comprises a controller 20 controlling a half bridge 21. A current flowing through half bridge 21 provides an output current Iout to a load or corresponds to the output current Iout received from the load. Half bridge 21 may be implemented in any conventional manner using two switches, as already explained above.

Controller 20 comprises a delay measurement circuit 23 configured to determine a switching delay of one or both switches of half bridge 21. A turn-on delay when turning on the switch, a turn-off delay when turning off the switch or both may be determined.

Controller 20 furthermore comprises a control circuit 22. Control circuit 22 may control switching of switches of half bridge 21 by generating corresponding control signals provided to control terminals of the switches. Furthermore, control circuit 22 is configured to determine the polarity of the current Iout, i.e. the current through the half bridge, based on the determined switching delay or plurality of switching delays. In some implementations, control circuit 22 may apply a dead time compensation based on the determined polarity, for example by modifying control signals controlling the switches of half bridge 21 or by modifying a reference voltage used for controlling the switches. Implementation of delay measurement circuit 23 as well as examples for determining the polarity and dead time compensation will be explained further below.

Figure 3:
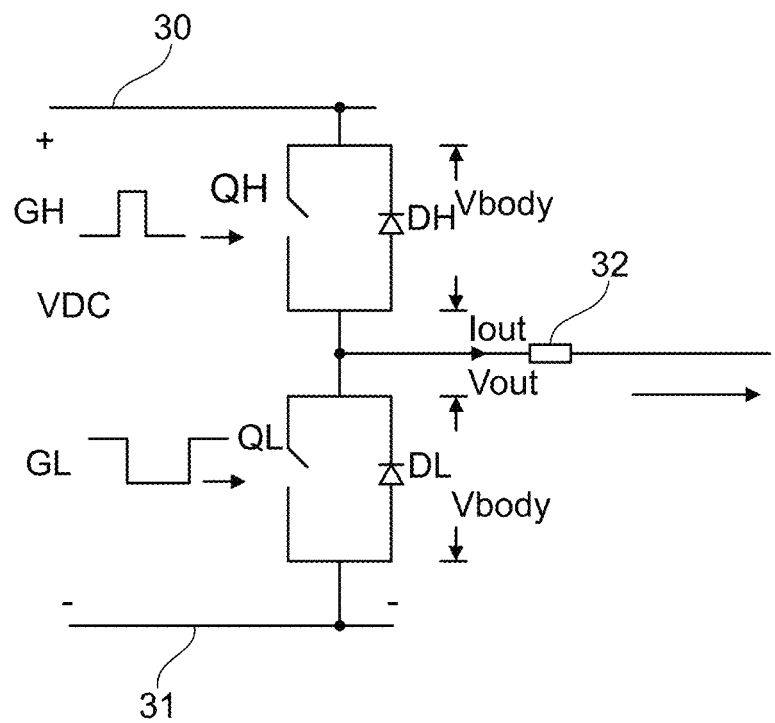
FIG. 3 is an example half bridge used for the explanation of embodiments.

FIG. 3 is a circuit diagram of a half bridge which will be used for the following explanations. The half bridge of FIG. 3 also is an example for an implementation of half bridge 21 of FIG. 2 or the half bridge used in the method of FIG. 1. The half bridge of FIG. 3 comprises a first switch QH as a high-side switch and a second switch QL as a low-side switch coupled between a first potential 30 and a second potential 31. First potential 30 is more positive than second potential 31. For example, first potential 30 may correspond to a plus pole of a battery, or to a positive supply voltage like VDD, and second potential 31 may correspond to a minus pole of a battery, a negative supply voltage or ground. Therefore, a DC (direct current) voltage VDC is applied between first potential 30 and second potential 31.

High-side switch QH is controlled by a control signal GH, and low-side switch QL is controlled by a control signal GL.

High-side switch QH has a first freewheeling diode DH connected in parallel thereto, and low-side switch QL has a second freewheeling diode DL connected in parallel thereto. As already explained above, switches QH, QL may be transistor switches, and freewheeling diodes DH, DL may be diodes intrinsic to the design of the transistors or may be provided separately.

A current Iout through the half bridge, which is generated when switches QH, QL are closed and opened according to some switching scheme, flows from a node between switches QH, QL to a load 32 or flows from the load 32 to the node between switches QH, QL and is also referred to as output current. The polarity of current Iout indicates if current Iout flows from the half bridge towards load 32 or from load 32 towards the half bridge. For example, a current Iout flowing towards load 32 may be called a positive current with a positive polarity herein, and a current Iout flowing towards the half bridge will be referred to as a negative current having a negative polarity herein. However, it is to be understood that this is merely a convention for naming, and the reverse naming may also be used.

A voltage across high-side switch QH or low-side switch QL will be referred to as body voltage Vbody of the respective switch herein. In case of field effect transistor switches, this body voltage Vbody may correspond to a drain-source voltage Vds of the respective transistor.

Figure 4A:
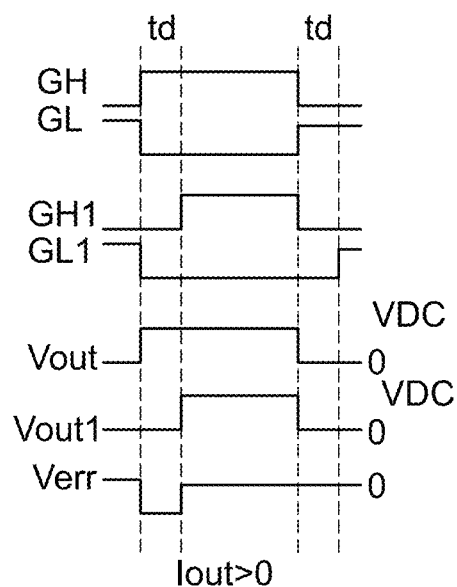
FIGS. 4A and 4B are signal diagrams illustrating an example operation of the half bridge of FIG. 3.
Figure 4B:
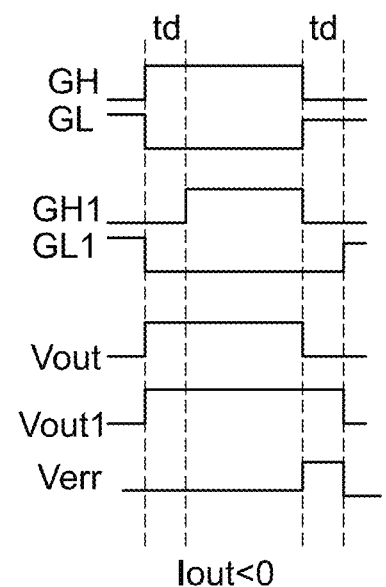

FIGS. 4A and 4B illustrate switching of the switches QH, QL of the half bridge of FIG. 3 in case of a positive current Iout (Iout>0) in FIG. 4A and in case of a negative current Iout (Iout <0) in FIG. 4B.

It should be noted that FIGS. 4A and 4B are somewhat simplified schemes as switch on and switch off transients of high-side switch QH and low-side switch QL are not considered.

In FIG. 4A, for the case Iout >0, signals GH, GL show ideal control signals for high-side switch QH and low-side switch QL of FIG. 3, respectively, according to some switching scheme to generate a desired output voltage Vout at the node between the switches. In FIG. 4A and the following switches, a "high" control signal indicates that the respective switch is closed, and a "low" control signal indicates that the respective switch is open. In this ideal case, high-side switch QH and low-side switch QL switch simultaneously, for example when the high-side switch QH turns on, the low-side switch QL simultaneously turns off and vice versa.

In practice, such a switching scheme has the danger of short circuits between the first potential 30 and the second potential 31, and, therefore, dead times td are inserted. This leads to modified control signals GH1, GL1 also shown in FIG. 4A.

Vout in FIG. 4A shows an ideal output voltage for the ideal switching scheme using control signals GH, GL, and Vout1 shows the output voltage in case of dead time insertion. In this case, after the low-side switch QL turns off controlled by control signal GL1, the current Iout flows through diode DL until QH turns on, and therefore Vout1 remains low during this dead time td until QH turns on corresponding to control signal GH1. When QH turns off, the current Iout flows through diode DL, and Vout1 goes to low (corresponding to second potential 31) immediately.

Due to the dead times td, Vout1 is different from the ideal output voltage Vout, and the difference is indicated as an error voltage in FIG. 4A.

FIG. 4B shows the same signals GH, GL and GH1, GL1 as in FIG. 4A, as well as Vout, Vout1 and Verr, for the case of current Iout<0. In this case, when the low-side switch QL is switched off by signal GL1, the output voltage Vout1 changes immediately. On the other hand, the output voltage Vout1 goes down to the second potential 31 only after the low-side switch QL has been switched off by signal GL1, leading to the differences between Vout1 and Vout and a corresponding error voltage as shown in FIG. 4B. As can be seen from FIGS. 4A and 4B, the error voltage Verr is different for different polarities of the current Iout. Therefore, for compensating this error voltage, it is helpful to determine the polarity of the current Iout in some applications.

Figure 5:
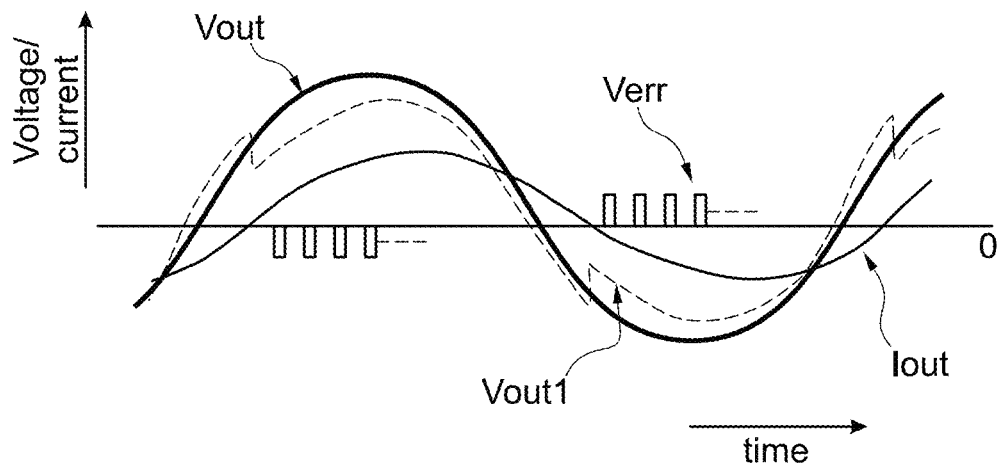
FIG. 5 is a diagram for illustrating voltages and currents of a half bridge.

To explain further, where switches QH, QL are operated to generate a sinusoidal output voltage as an example, an ideal output voltage Vout, an actual output voltage Vout1, a corresponding output current Iout and error voltage Verr are shown in FIG. 5 as a schematic example. As a load, an inductive load is taken as an example. FIG. 5 shows the ideal output voltage Vout as a sinusoidal voltage, and distortions in the actual output voltage Vout1 generated by the insertion of dead times. The distortion comprises both low frequency harmonics and switching frequency harmonics. As already explained initially, this may lead to various negative effects on the performance of a system incorporating the half bridge may result.

According to embodiments, dead time compensation techniques are applied relying on the polarity of the current. As in conventional approaches the determination of the polarity may have some drawbacks, in embodiments discussed herein the polarity of Iout is determined based on a measurement of a switching delay. Based on this determined polarity, then conventional dead time compensation techniques may be applied. For example, a compensation voltage having an opposite sign of the error voltage (which sign depends on the polarity as explained above) may be applied, for example by modifying a switching scheme of the switches to provide the error voltage or by modifying an additional voltage provided accordingly.

Switching delay measurements and determining the polarity of the current Iout based on the delay measurements will be described next.

Figure 6:
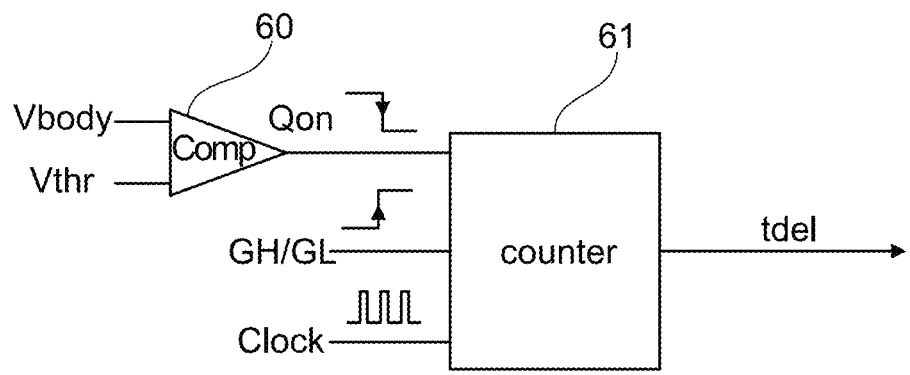
FIG. 6 illustrates a delay measurement circuit according to an embodiment.

FIG. 6 illustrates a delay measurement circuit according to an embodiment. The delay measurement circuit of FIG. 6 comprises a comparator 60 and a counter 61. With the delay measurement circuit of FIG. 6, the switching delay of each of switches QH, QL of FIG. 3 may be measured.

Comparator 60 receives the body voltage Vbody at a first input and a threshold voltage Vthr at a second input thereof. The threshold voltage may be a threshold voltage corresponding to a voltage indicating that the respective switch switches on or off when the threshold voltage is crossed. In transistors, the threshold voltage may indicate that the on-charge Qon of the transistor has been reached. Therefore, in FIG. 6 the output signal of comparator 60 is labeled Qon. It should be noted that in other embodiments, instead of the body voltage Vbody another voltage at the respective switch may be used, for example a voltage between a control terminal and one of the load terminals in case of transistor switches, like a gate-drain voltage.

When signal Qon changes its state, this indicates that the transistor has actually switched. This signal Qon is provided to a first input of counter 61.

The respective control signal for the switch of which the switching delay is to be measured, i.e. GH or GL, is provided to a second input of counter 61. Counter 61 is clocked by a clock signal clock.

Counter 61 counts the time between a signal change of Qon and an edge of the control signal GH or GL, i.e. starts counting based on one of the signals and stops counting based on the other of the signals. The counting is based on the clock signal. In this way, a switching delay tdel is provided as a time difference between the actual switching of the switch, as indicated by signal Qon, and the nominal (intended) switching of the switch, as indicated by the respective control signal GH or GL.

The switching delay may be measured for one or more switching on high-side switch QH, switching off high-side switch QH, switching on low-side switch QL or switching off low-side switch QL, and the polarity of the current Iout may be determined based on any of these measurements or combinations thereof. This will be explained next referring to FIGS. 7 to 14, where all these possible cases will be discussed. In each of FIGS. 7 to 14, the respective FIG. A (7A, 8A, . . . , 14A) shows the half bridge of FIG. 3 with an indication of the polarity of the output current and an indication of a current path during a dead time, and a respective FIG. B (7A, 8B, . . . , 14B) shows corresponding signals.

Figure 7A:
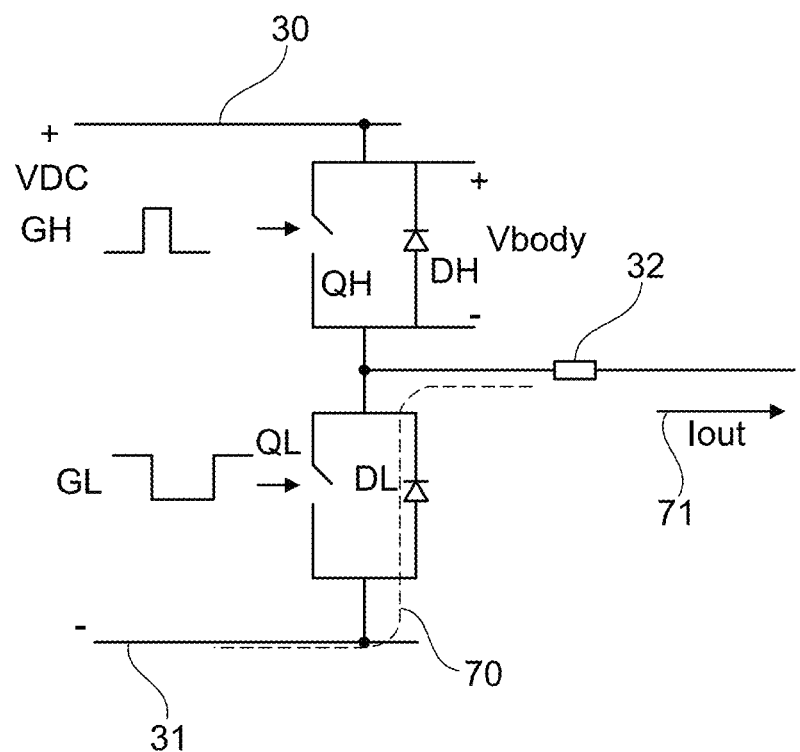
FIGS. 7A, 7B, 8A, 8B, 9A, 9B, 10A, 10B, 11A, 11B, 12A, 12B, 13A, 13B, 14A and 14B illustrate the determination of a polarity of a current through a half bridge in various situations.
Figure 7B:
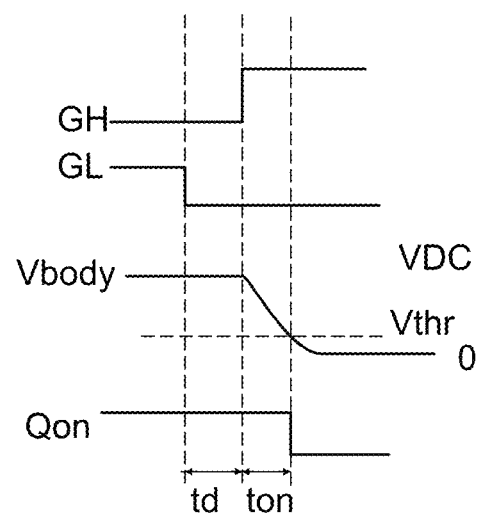

FIGS. 7A and 7B illustrate a case where the output current Iout is positive as indicated by an arrow 71 and the switching delay of high-side switch QH is measured. Low-side switch QL is switched off and high-side switch QH is switched on, separated by a dead time td.

In the situation of FIGS. 7A and 7B, after the low-side switch QL has been switched off and before the high-side switch QH is switched on (i.e. during the dead time td shown in FIG. 7B), the output current Iout essentially flows from second potential 31 to load 32 via a current path through the freewheeling diode DL as indicated by a dashed line 70. During this time, Vbody of high-side switch QH remains high (high voltage drop across the transistor, corresponding to a non-conducting state). After the rising edge of GH, high-side switch QH begins to turn on, and Vbody decreases until the threshold voltage Vthr is reached and Qon toggles. The time delay between the rising edge of signal GH and the falling edge of signal Qon is the switching delay, in this case an on-time delay ton. In other words, ton is defined at the time of the falling edge of Qon minus the time of the rising edge of GH. This on-time delay ton is positive with respect to the rising edge of GH, or in other words occurs after the dead time td.

Figure 8A:
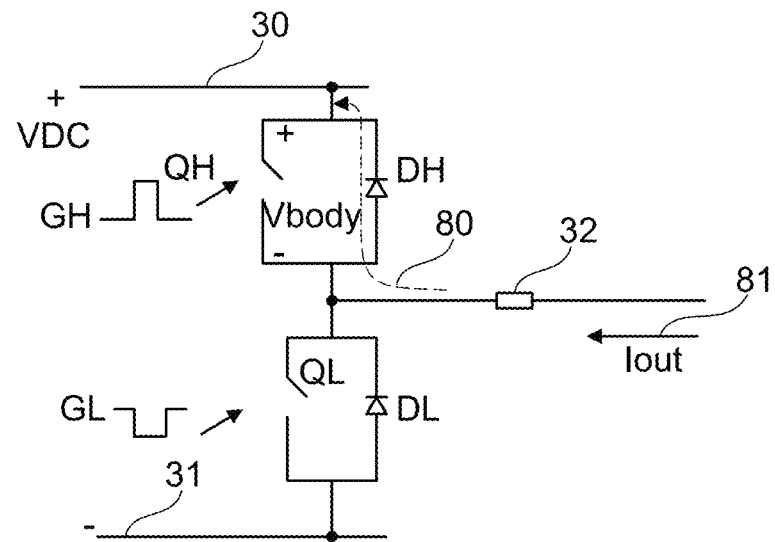
Figure 8B:
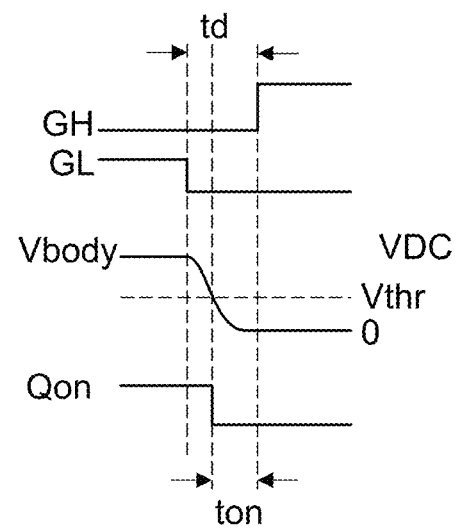

FIGS. 8A and 8B again show the case of switching on high-side switch QH and switching off low-side switch QL separated by a dead time as in FIGS. 7A and 7B, but in this case with a current Iout<0 as indicated by an arrow 81. In this case, after low-side switch QL is switched off, the output current, as indicated generally by an arrow 81 and more specifically by a current path 80, flows through diode DH. Due to this, Vbody of high-side switch QH decreases and turns low before the rising edge of GH. In other words, as can be seen in FIG. 8B, Vbody crosses the threshold value Vthr before the rising edge of GH arrives, and consequently, the falling edge of Qon occurs before the rising edge of GH arrives. With the same definition of the turn-on delay ton as before, namely the time of the falling edge of Qon minus the time of the rising edge of GH, in this case ton is negative.

Therefore, by measuring the turn-on delay of high-side switch QH as the switching delay, for example with the circuit of FIG. 6 (in this case tdel corresponds to ton) and by comparing the determined switching delay ton to a threshold value, for example zero, the polarity of the current may be determined when measuring the turn-on delay of the high-side switch. For example, if ton is greater than zero, the polarity of the current is positive, and if ton is smaller than zero, the polarity of the current is negative.

Next, the case where high-side switch QH is switched off and low-side switch QL is switched on separated by a dead time will be discussed, where again the switching delay (in this case a turn-off delay) of the high-side switch QH is measured.

Figure 9A:
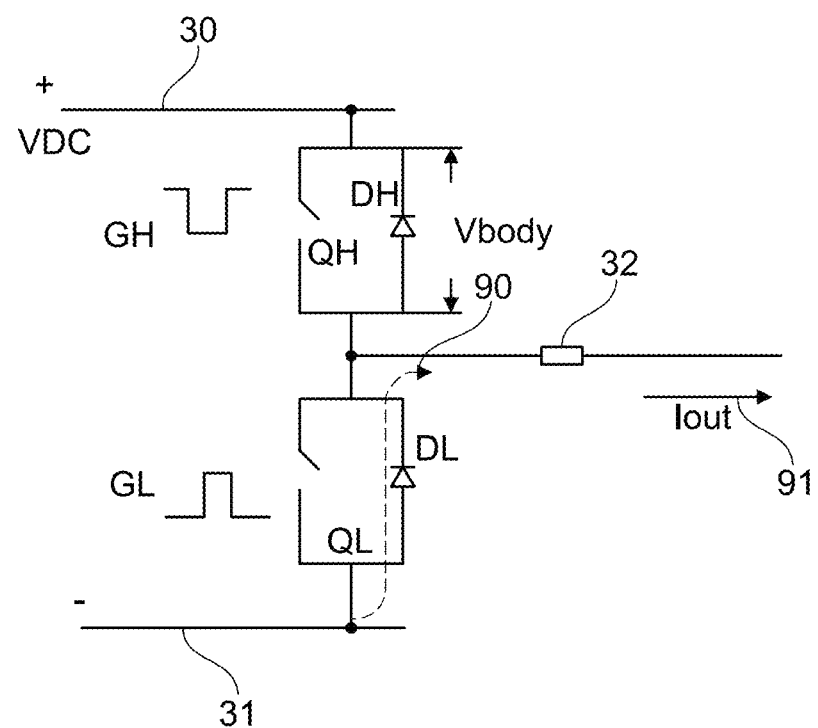
Figure 9B:
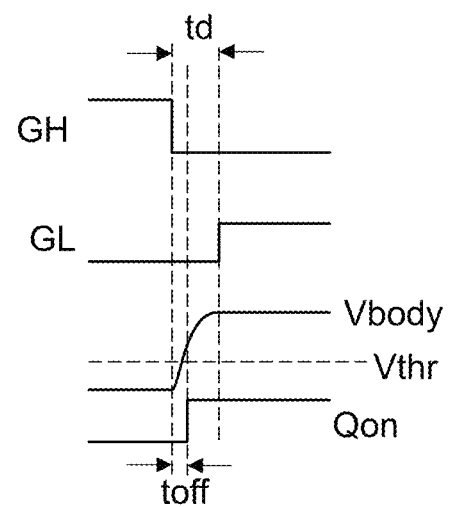

FIGS. 9A and 9B show the case where the current Iout is positive, as indicated by an arrow 91.

In this case, when the falling edge of GH arrives indicating that high-side switch QH should be switched off, high-side switch QH actually starts to switch off, body voltage Vbody across high-side switch QH starts to rise and reaches the threshold value Vthr. In this case, during the dead time, current flows through the diode DL, as indicated by a dashed line 90. The turn-off delay toff in this case is the time which high-side switch QH intrinsically needs to turn off.

Figure 10A:
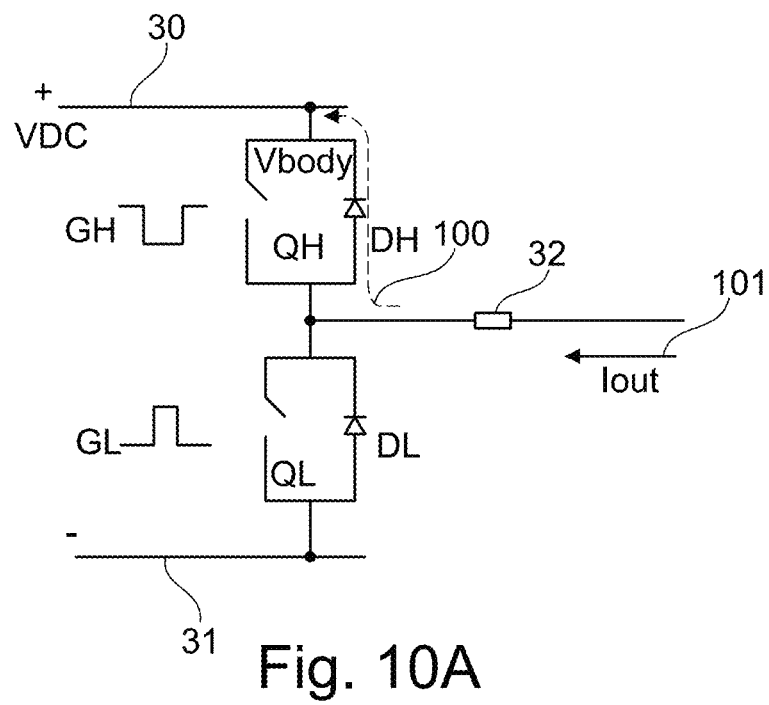
Figure 10B:
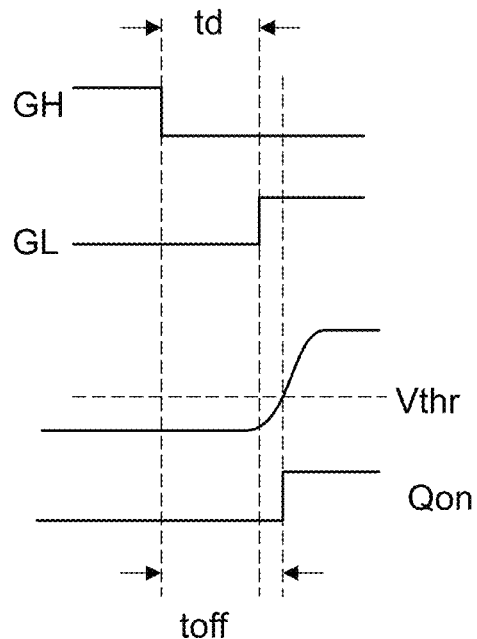

FIGS. 10A and 10B show the situation for the turn-off delay of high-side switch QH in case of a negative polarity of the output current, as indicated by an arrow 101. In this case, when the falling edge of control signal GH arrives, while high-side switch QH starts to switch off as indicated by dashed lines 100, the current flows via diode DH, which causes the body voltage Vbody to remain low and rise only after the dead time td has passed and low-side switch QL starts to turn on. In this case, the measured turn-off delay toff between the rising edge of Qon and the falling edge of GH essentially is the dead time td plus the intrinsic device turn-on delay of low-side switch QL and in particular is larger than the dead time td. Therefore, when the turn-off delay of the high-side switch is evaluated, the dead time td may be used a threshold, and if the measured turn-off delay toff is smaller than the dead time td, the polarity of the current is positive, and when the measured turn-off delay toff is greater than td, the polarity is negative.

Next, determining the polarity of current Iout based on a switching delay (in this case turn-on delay) when switching on the low-side switch QL will be discussed with reference to FIGS. 11 and 12.

Figure 11A:
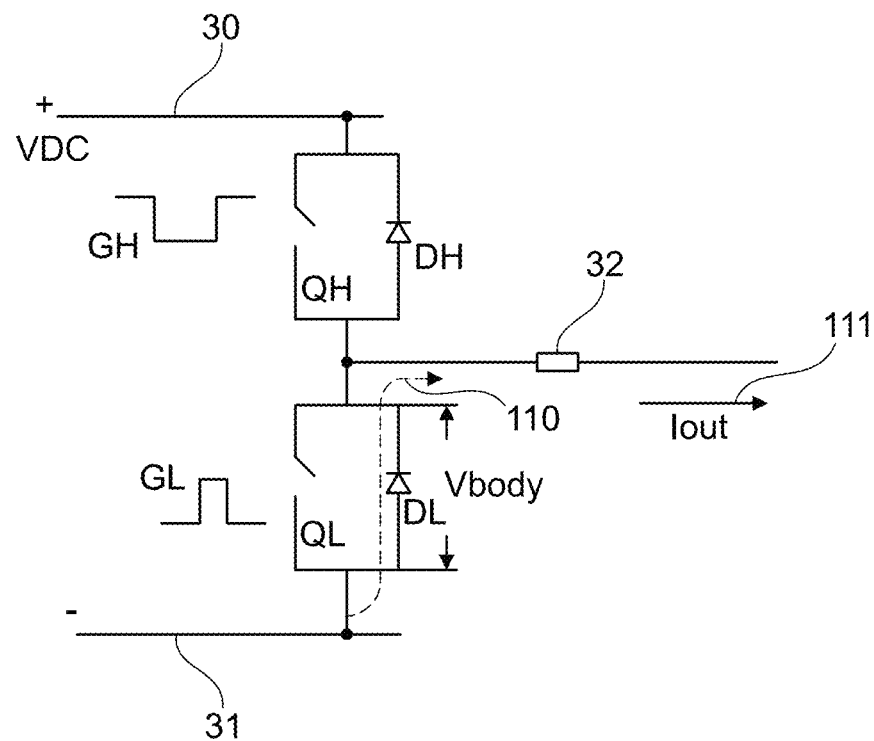
Figure 11B:
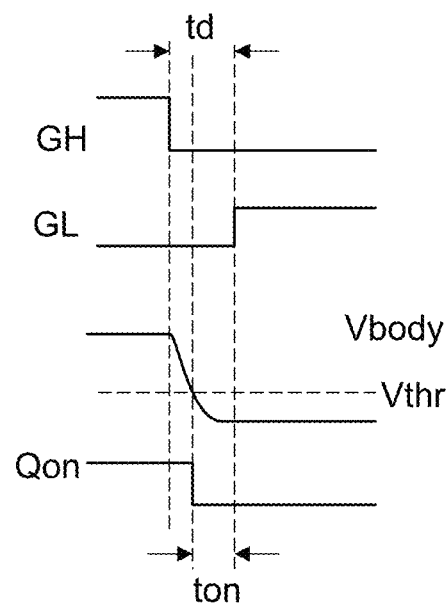

When current Iout is positive as indicated by an arrow 111 in FIG. 11A, after high-side switch QH is switched off, freewheeling current flows via diode DL, as indicated by dashed lines no. Therefore, the body voltage Vbody begins to fall and crosses the threshold value even before the rising edge of GL indicates switching on of low-side switch QL. In this case, if the turn-on delay ton is again defined as the time of the falling edge of Qon minus the time of the rising edge of GL (similar to the situation of FIGS. 7 and 8), ton is negative. In other words, the turn-on delay in this case corresponds to td minus the time high-side switch QH requires to switch off after the falling edge of GH.

Figure 12A:
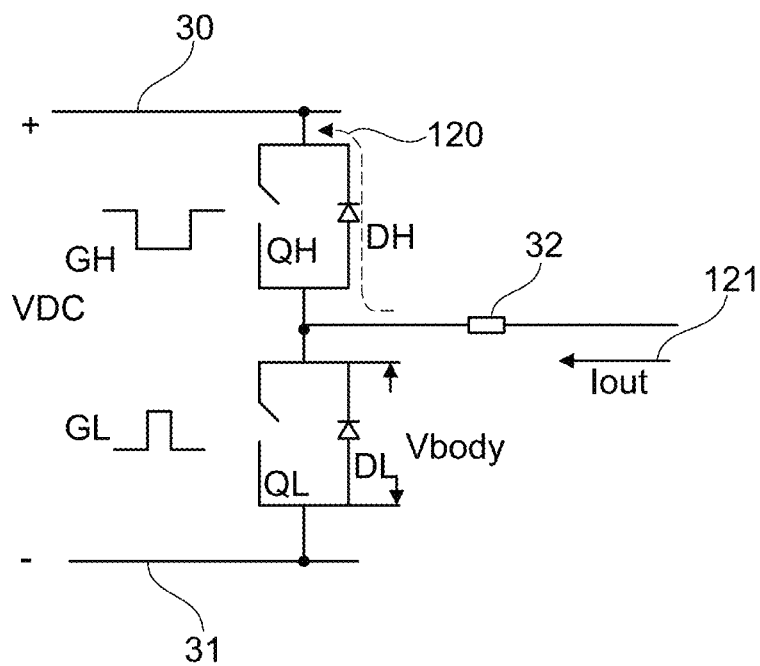
Figure 12B:
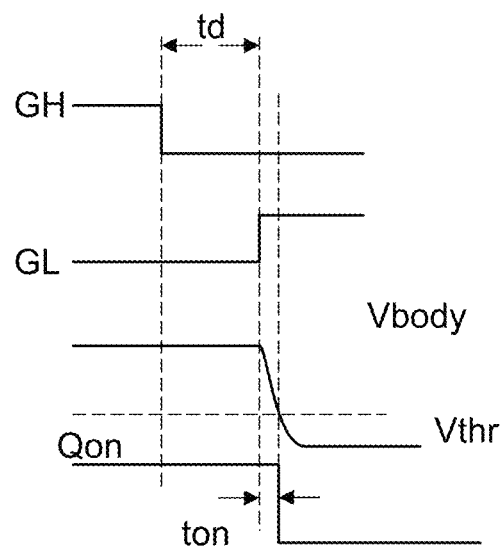

FIGS. 12A and 12B illustrate the situation where Iout is negative, as indicated by an arrow 121. In this case, during the dead time, the current flows via diode DH, as indicated by dashed lines 120. Therefore, body voltage Vbody across low-side switch QL remains high until the rising edge of GL switches low-side switch QL on, upon which body voltage Vbody begins to drop until it reaches the threshold voltage. In this case, when ton is again defined as the time of the falling edge of QN minus the time of the rising edge of GL, ton is positive. Therefore, by comparing ton when switching on low-side switch QL with a threshold of zero, the polarity of current Iout may be determined.

Finally, with respect to FIGS. 13 and 14, measuring the turn-off delay of low-side switch QL and deriving the polarity of the output current from the measurement will be explained.

Figure 13A:
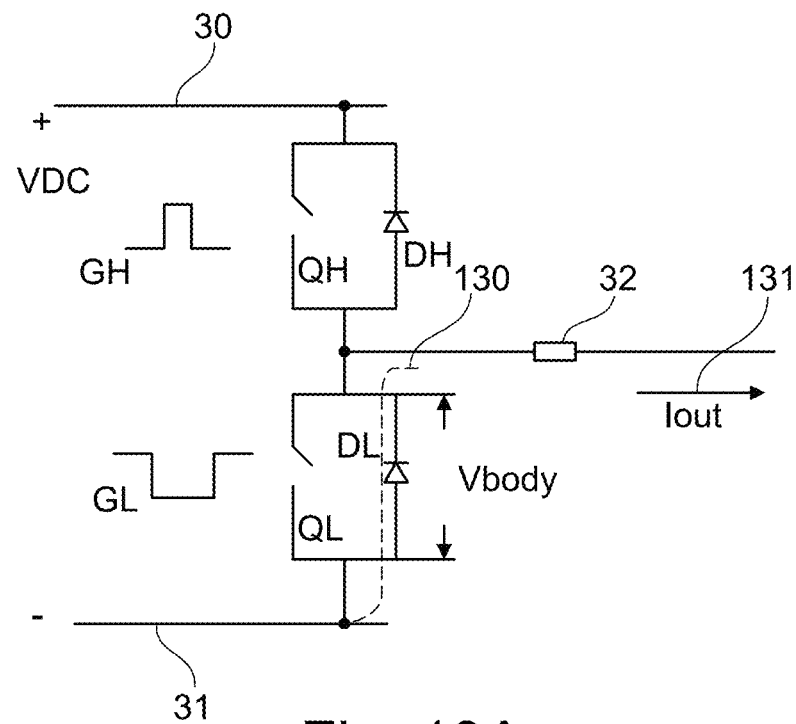
Figure 13B:
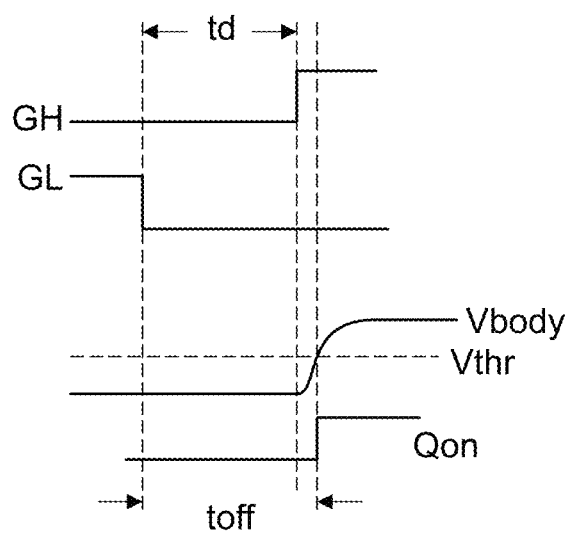

FIGS. 13A and 13B show a case where the polarity of current Iout is positive, as indicated by an arrow 131. In this case, during the dead time as indicated by a dashed line 130 current flows via diode DL. Due to this, body voltage Vbody remains low even after the falling edge of GL indicating that low-side switch QL is to be switched off and rises only after the rising edge of GH switches high-side switch QH on. Therefore, the turn-off delay toff in this case measured as a difference between the rising edge of Qon and the falling edge of GL corresponds to the dead time td plus the turn-on time of high-side switch QH and is greater than the delay time td.

Figure 14A:
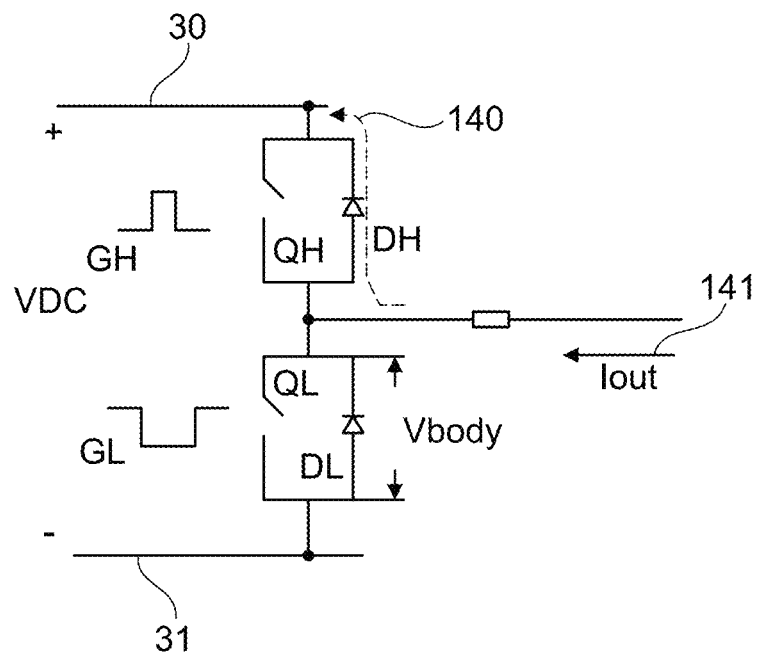
Figure 14B:
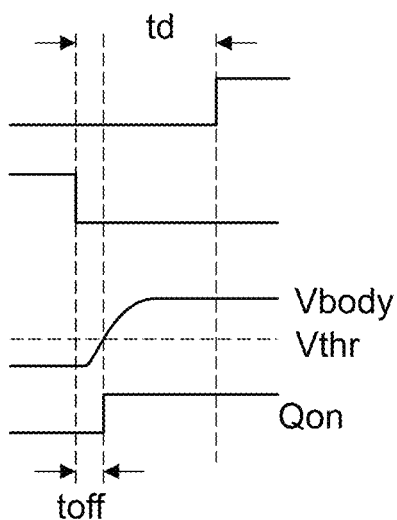

FIGS. 14A and 14B show a case where the polarity of current Iout is negative, as indicated by an arrow 141 in FIG. 14A. Here, during the dead time as indicated by a dashed line 140 current flows through diode DH. The body voltage Vbody across low-side switch QL starts rising immediately after the falling edge of GL, and in this case the device turn-off time toff corresponds to the intrinsic turn-off time needed by low-side switch QL. In particular, in this case toff is smaller than td. Therefore, in this case by comparing toff to td as a threshold value, the polarity of the current Iout may be determined.

In summary, by measuring either the turn-on delay or the turn-off delay of either of high-side switch QH or low-side switch QL as switching delay, and by comparing the respective delay to a threshold (for example zero or the dead time td), the polarity of current Iout may be determined. Other thresholds between respective switching delays for the case Iout>0 and Iout<0 may also be used other than zero or the dead time td. For example, in other embodiments the threshold may have a value between a negative value and a value less than an actual turn-on delay time. A suitable value for the threshold may be determined by experiment. For example, for various known test currents having a known polarity a threshold may be selected which gives a correct determination of the polarity for all test currents. In this way, a threshold taking system noise into account may be determined.

It should be noted that in terms of practical implementations, measuring the turn-on delay of low-side switch QL may be advantageous in some cases, in particular as in some high-voltage systems, because second potential 31 often is a common ground in such devices, and coupling of, for example, the delay measurement circuit of FIG. 6 with low-side switch QL may be easier under such circumstances, for example in terms of isolation between voltage domains.

As explained above, switching delays of both the switching delay of a high-side switch and a low-side switch of a half bridge may be used to determine the polarity of a current through the respective half bridge. Furthermore, in some applications a plurality of half bridges may be provided, for example three half bridges for a three-phase inverter to drive a three-phase electric motor. In this case, common circuitry comprising one or more multiplexers may be used as delay measurement circuit for a plurality of switches. An example for a measurement circuit 150 usable in embodiments is shown in FIG. 15.

Figure 15:
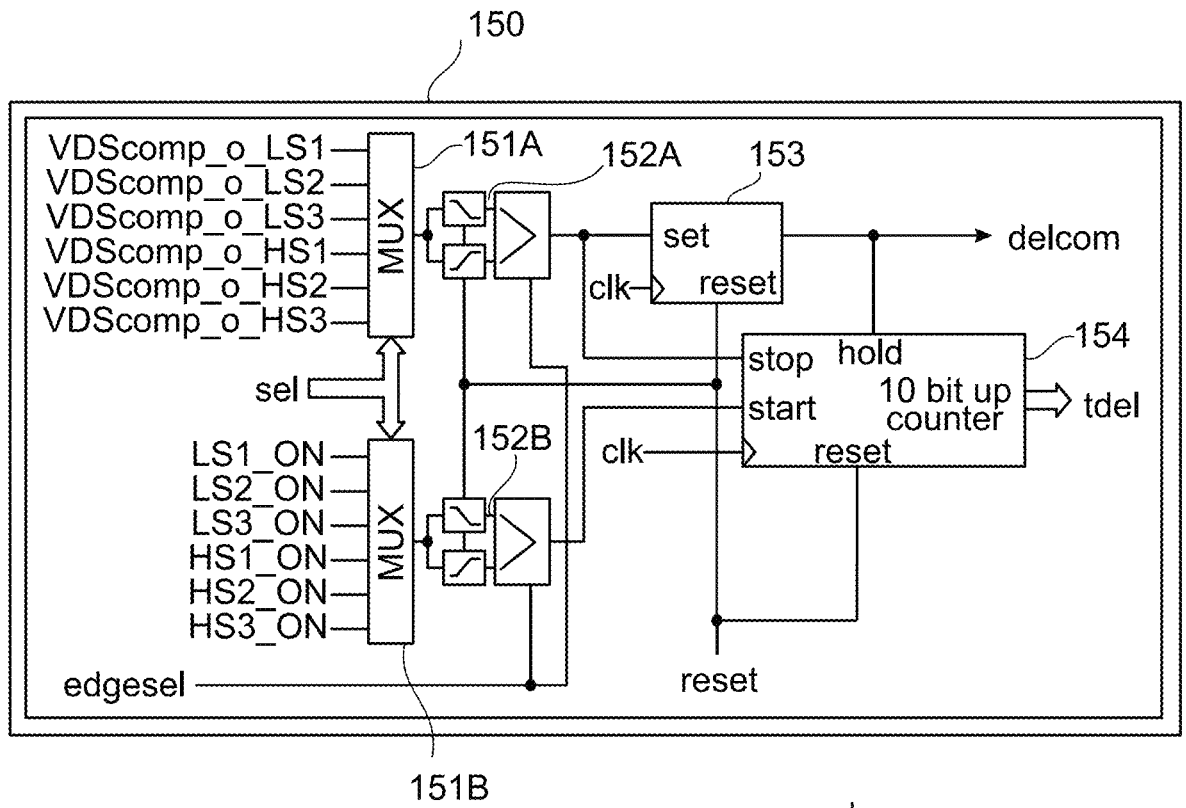
FIG. 15 is a block diagram of a delay measurement circuit usable in some embodiments.

The measurement circuit 150 is designed for a system comprising a three-phase inverter based on three half bridges, each one comprising a respective high-side switch (HS1-HS3 in the signals of FIG. 15) and a respective low-side switch (LS1-LS3 in the signals of FIG. 15).

Signals from respective comparators assigned to the switches HS1-HS3; LS1-LS3, each one comparing the body voltage Vbody, for example a drain-source voltage Vds, to a threshold value, are provided to a first multiplexer 151A. Control signals controlling the switches (similar to signals GH, GH of FIG. 3) are provided to a second multiplexer 151B. Using first and second multiplexers 151A, 151B, one of the switches is selected for a delay measurement. The respective selected signals are provided to circuitry 152A, 152B, respectively. Each circuitry 152A, 152B includes an edge detection circuit for detecting rising edges, an edge detection circuit for detecting falling edges and an edge signal selection circuit, e.g. a multiplexer, which selects either the detected rising edges or the detected falling edges as an output based on a signal edgesel.

The selected detected edges are provided to stop and start inputs, respectively, of a counter 154, which essentially has the same function as counter 61 of FIG. 6. Counter 154 is clocked by a clock signal clk. Counter 154 outputs the switching delay tdel.

Furthermore, the output of circuitry 152 which is provided to the stop input of counter 154 is additionally provided to a set input of a latch 153 clocked by clock signal clk. Latch 153 outputs a signal delcom indicating completion of the delay measurement.

Based on the detected edges, counter 154 and latch 153 are also reset after each delay measurement for a next delay measurement. An external reset signal labeled reset in FIG. 15 may also be applied.

For example, if a low side switch turn-on delay is to be measured, rising edges may be selected by signal edgesel. The rising edge of the corresponding signal LSx_ON (x=1-3) selected by multiplexer 151B then triggers counter 154 to start, and the falling edge of Vds_comp_0_LSx (x=1-3) selected by multiplexer 151A stops the counter and sets the completion signal delcom. Then, the falling edge of LSx_ON or the rising edge of Vds_comp_0_LSx resets counter 154 and latch 153 to prepare for the next delay measurement.

In some embodiments, measurement circuit 150 may be a measurement circuit also used for other purposes, for example for detecting if the respective switch HS1-HS3; LS1-LS3 is in "good health" by checking if the measured switching delay is within a specified range. Such monitoring of the health of a switch based on the switching delay is already used in some conventional devices. In such a case, in embodiments the measurement circuit already provided for this monitoring may additionally be used to detect the polarity of the current through the half bridge by comparing tdel with a threshold, as discussed above, so little additional circuitry is needed.

In FIG. 15 multiplexers 151A, 151B are used such that only one counter 154 is provided for a plurality of switches, and therefore, the switching delay and therefore the polarity may be measured only for one switch at a single time. Switching of low-side switch and high-side switch usually occurs at or near a zero-crossing of a respective current Iout of the respective half bridge. Therefore, in embodiments, zero-crossings of the current for different half bridges are predicted, and a switch for measuring the switching delay is selected based on the prediction. An example will be explained referring to FIGS. 16 and 17.

Figure 16:
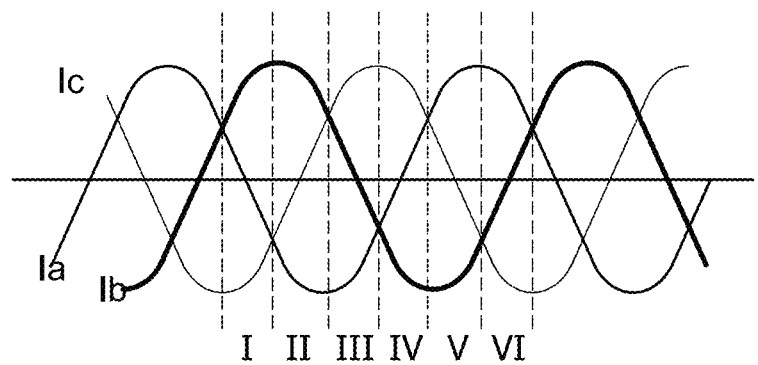
FIG. 16 illustrates output currents for a three-phase inverter.

FIG. 16 shows three output currents Ia, Ib and Ic as a typical output for a three-phase inverter. The operation may be divided into six phases labeled I to VI in FIG. 16. In each of the phases, one of the currents crosses zero. In particular, the relationship of the currents in each phase I to VI are:

I: Ib>Ia>Ic
II: Ib>Ic>Ia
III: Ic>Ib>Ia
IV: Ic>Ia>Ib
V: Ia>Ic>Ib
VI: Ia>Ib>Ic

In each phase I to VI, the respective "middle current" Ia, Ib or Ic, the magnitude of which is comprised between the respective magnitudes of the other two currents makes a zero-crossing.

Figure 17:
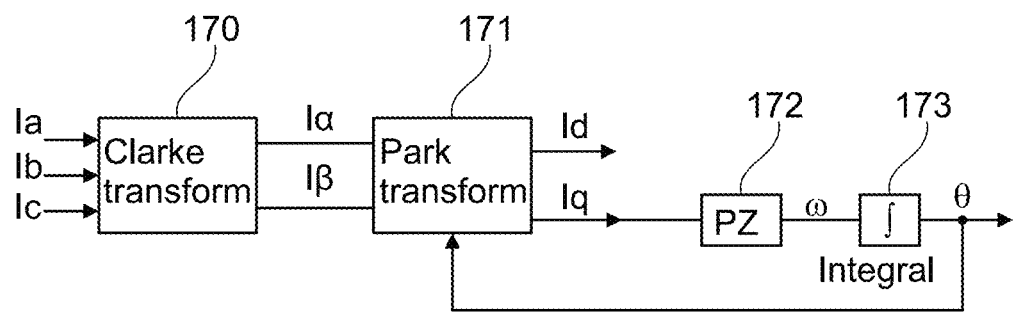
FIG. 17 is a block diagram of a circuit for phase estimation usable in some embodiments.

For the half bridge generating this "middle current", in each phase, the polarity may be determined based on the techniques discussed above. For the three currents Ia, Ib, Ic, at least in an ideal case the relationship Ia+Ib+Ic=0 holds. With phase angle $\theta=\omega t$, $\omega$ being the angular frequency of the current I and t being the time, the currents Ia, Ib, Ic may be written as:

$Ia = I \cdot \sin(\theta)$
$Ib = I \cdot \sin(\theta - 2/3\pi)$
$Ic = I \cdot \sin(\theta - 4/3\pi)$ For the six phases I to VI, the following applies for phase angle θ:

I: $5/6\pi < \theta < 7/6\pi$
II: $7/6\pi < \theta < 3/2$
III: $3/2\pi < \theta < 11/6\pi$
IV: $11/6\pi < \theta < 13/6\pi$
V: $2/6\pi < \theta < 2/2\pi$
VI: $2/2\pi < \theta < 5/6\pi$ Based on this, phase angle θ may be determined with a circuit as shown in FIG. 17. The currents Ia, Ib, Ic are subjected to a Clarke transform 170 followed by a Park transform 171. An output signal of Park transform 171 is provided to a proportional-integral (PI) controller 172 to obtain the angular velocity ω, which is then integrated by an integrator 173. The resulting phase angle θ is fed back to the Park transform 171. In this way, phase angle θ may be determined, and, in embodiments, based on the phase angle θ a half bridge for analysis is selected, for example by using multiplexers 151A, 151B of FIG. 15 such that a high-side switch is selected in case of a rising current (zero-crossing in the positive direction, for example in phases II, IV and VI of FIG. 16) and the respective low-side switch is selected for the remaining phases, which corresponds to an analysis of the turn-on delay. The reverse selection may also be made to analyze the turn-off delay, as explained above.

Next, some measurement results showing the effect of techniques discussed herein will be described referring to FIG. 18 comprising FIGS. 18A to 18D.

Figure 18A:
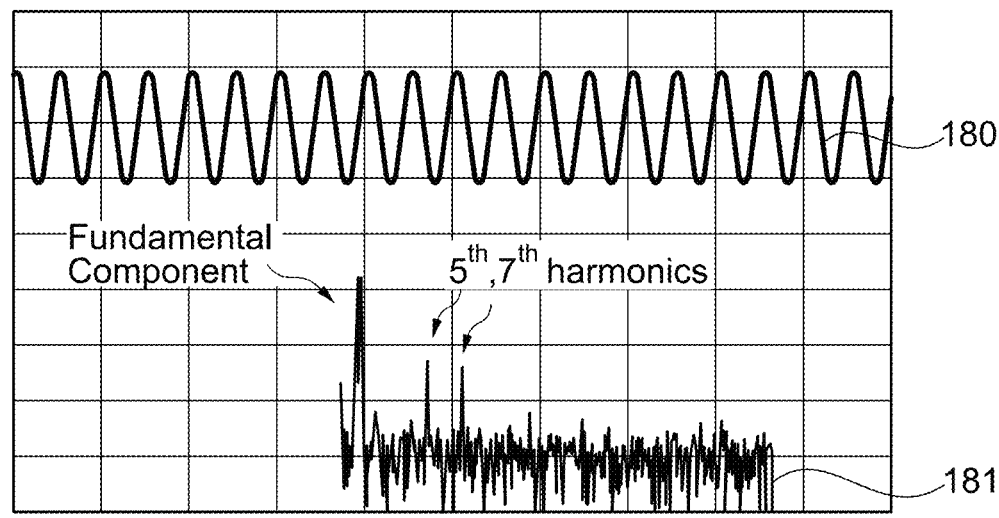
FIGS. 18A to 18D illustrate measurement results with dead time compensation according to techniques disclosed herein and according to a comparative example.
Figure 18B:
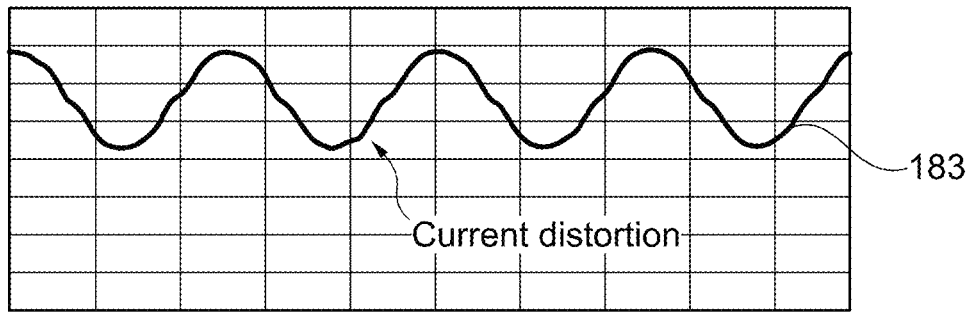

The measurements have been done for a half bridge of a three-phase inverter driving a three-phase brushless DC motor with vector control run at 20 Hz, with a dead time of 1 μs and 20 kHz switching frequency. FIGS. 18A and 18B show measurement results without a dead time compensation technique applied. In FIG. 18A, a curve 180 shows the output voltage, and a curve 181 shows a spectrum of the output voltage obtained by a fast Fourier transformation (FFT). As can be seen, strong fifth and seventh harmonics are present in addition to the fundamental component. A curve 183 illustrates the output current, which has visible distortions.

Figure 18C:
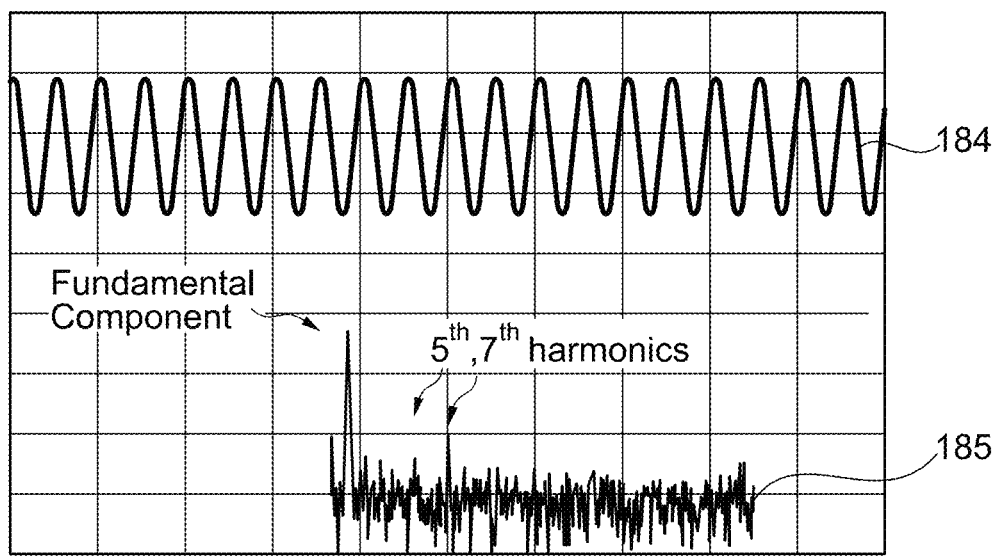
Figure 18D:
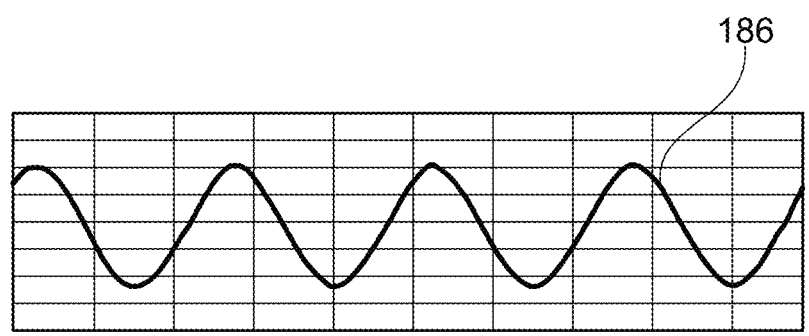

FIGS. 18C and 18D show measurement results for a case where dead time compensation based on a detection of polarity as described herein has been applied. FIG. 18C corresponds to FIG. 18A and a curve 184 shows the output voltage and a curve 185 shows the spectrum obtained by fast Fourier transformation. As can be seen, compared to curve 181, the fifth and seventh harmonics are suppressed. This leads to an output current shown in a curve 186 of FIG. 18D with reduced distortions.

Some embodiments are defined by the following examples:

Example 1. A method for determining a polarity of a current through a half bridge, comprising:
determining a switching delay of at least one of a high-side switch or a low-side switch of the half bridge, and
determining a polarity of a current through the half bridge based on the switching delay.

Example 2. The method of example 1, wherein the polarity of the current through the half bridge is determined based on a comparison of the switching delay with a threshold.

Example 3. The method of example 2, wherein the threshold is zero.

Example 4. The method of example 2, wherein the threshold is essentially equal to a dead time of the half bridge.

Example 5. The method of any one of examples 1 to 4, wherein the switching delay of the at least one of the high-side switch or the low-side switch of the half bridge is determined as a time difference between a nominal switching time according to a control signal of the at least one of the high-side switch or the low-side switch and a time when a voltage across the at least one of the high-side switch or the low-side switch crosses a predefined threshold voltage.

Example 6. The method of example 5, wherein the nominal switching time comprises a time of a rising edge or a falling edge of the control signal.

Example 7. The method of example 5 or 6, wherein the at least one of the high-side switch or the low-side switch is a transistor switch, and the threshold voltage is a threshold voltage of the transistor switch.

Example 8. The method of any one of examples 5 to 7, wherein the at least one of the high-side switch or the low-side switch is a transistor switch, and wherein the voltage across the at least one of the high-side switch or the low-side switch comprises at least one of a voltage between load terminals of the transistor switch or a voltage between a control terminal and a load terminal of the transistor switch.

Example 9. The method of any one of examples 1 to 7, wherein the switching delay comprises at least one of a turn-off delay or a turn-on delay.

Example 10. The method of any one of examples 1 to 9, wherein the current is a current through a node between the high-side switch and the low-side switch.

Example 11. The method of any one of examples 1 to 10, further comprising selecting the half bridge for determining the switching delay from a plurality of half bridges based on a phase angle prediction.

Example 12. A method for dead time compensation in a half bridge, comprising:
determining a polarity of a current through the half bridge according to the method of any one of examples 1 to 11, and
applying a dead time compensation based on the polarity of the current through the half bridge.

Example 13. The method of example 12, wherein applying the dead time compensation comprises at least one of modifying a reference voltage upon which control of the half bridge is based or modifying a pulse width modulation pattern according to which the half bridge is controlled.

Example 14. A half bridge controller, comprising:
a measurement circuit configured to determine a switching delay of at least one of a high-side switch or a low-side switch of the half bridge, and
a control circuit configured to determine a polarity of a current through the half bridge based on the switching delay.

Example 15. The half bridge controller of example 14, wherein, for determining the polarity of the current through the half bridge, the control circuit is configured to compare the switching delay with a threshold.

Example 16. The half bridge controller of example 15, wherein the threshold is zero.

Example 17. The half bridge controller of example 15, wherein the threshold is essentially equal to a dead time of the half bridge.

Example 18. The half bridge controller of any one of examples 14 to 17, wherein the measurement circuit is configured to determine the switching delay of the at least one of the high-side switch or the low-side switch of the half bridge as a time difference between a nominal switching time according to a control signal of the at least one of the high-side switch or the low-side switch and a time when a voltage across the at least one of the high-side switch or the low-side switch crosses a predefined threshold voltage.

Example 19. The half bridge controller of example 18, wherein the measurement circuit comprises a comparator, wherein a first input of the comparator is configured to receive the voltage across the at least one of the high-side switch or the low-side switch and a second input of the comparator is configured to receive the threshold voltage.

Example 20. The half bridge controller of example 19, wherein the measurement circuit comprises a counter, wherein a first input of the counter is coupled to an output of the comparator, wherein a second input of the counter is configured to receive the control signal, and wherein the counter is configured to start counting based on a first signal at one of the first input or the second input and to stop counting based on a second signal at the other one of the first input or the second input.

Example 21. The half bridge controller of any one of examples 18 to 20, wherein the nominal switching time comprises a time of a rising edge or a falling edge of the control signal.

Example 22. The half bridge controller of any one of examples 18 to 21, wherein the at least one of the high-side switch or the low-side switch is a transistor switch, and the threshold voltage is a threshold voltage of the transistor switch.

Example 23. The half bridge controller of any one of examples 18 to 22, wherein the at least one of the high-side switch or the low-side switch is a transistor switch, and wherein the voltage across the at least one of the high-side switch or the low-side switch comprises at least one of a voltage between load terminals of the transistor switch or a voltage between a control terminal and a load terminal of the transistor switch.

Example 24. The half bridge controller of any one of examples 14 to 23, wherein the switching delay comprises at least one of a turn-off delay or a turn-on delay.

Example 25. The half bridge controller of any one of examples 14 to 24, wherein the current through the half bridge is a current through a node between the high-side switch and the low-side switch.

Example 26. The half bridge controller of any one of examples 14 to 25, further comprising:
a prediction circuit configured to predict a phase angle for a plurality of half bridges, and
a multiplexer configured to select the half bridge for determining the switching delay from the plurality of half bridges based on the phase angle.

Example 27. A half bridge controller of any one of examples 14 to 26, wherein the control circuit is further configured to apply a dead time compensation based on the polarity of the current through the half bridge.

Example 28. The half bridge controller of example 27, wherein the control circuit is configured to apply the dead time compensation by at least one of modifying a reference voltage upon which control of the half bridge is based or modifying a pulse width modulation pattern according to which the half bridge is controlled.

Example 29. A system, comprising a half bridge and the half bridge controller of any one of examples 14 to 28.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for determining ascertaining a polarity of a current through a half bridge, comprising:
measuring a switching delay of at least one of a high-side switch or a low-side switch of the half bridge, and
ascertaining the polarity of the current through the half bridge based on the measured switching delay.

2. The method of claim 1, wherein the polarity of the current through the half bridge is ascertained based on a comparison of the measured switching delay with a threshold.

3. The method of claim 1, wherein the switching delay of the at least one of the high-side switch or the low-side switch of the half bridge is measured as a time difference between a nominal switching time according to a control signal of the at least one of the high-side switch or the low-side switch and a time when a voltage across the at least one of the high-side switch or the low-side switch crosses a predefined threshold voltage.

4. The method of claim 3, wherein the nominal switching time comprises a time of a rising edge or a falling edge of the control signal.

5. The method of claim 3, wherein the at least one of the high-side switch or the low-side switch is a transistor switch, and the predefined threshold voltage is a threshold voltage of the transistor switch.

6. The method of claim 3, wherein the at least one of the high-side switch or the low-side switch is a transistor switch, and wherein the voltage across the at least one of the high-side switch or the low-side switch comprises at least one of a voltage between load terminals of the transistor switch or a voltage between a control terminal and a load terminal of the transistor switch.

7. The method of claim 1, wherein the switching delay comprises at least one of a turn-off delay or a turn-on delay.

8. The method of claim 1, further comprising selecting the half bridge for measuring the switching delay from a plurality of half bridges based on a phase angle prediction.

9. A method for dead time compensation, comprising:
ascertaining the polarity of the current through the half bridge according to the method of claim 1, and
applying a dead time compensation based on the polarity of the current through the half bridge.

10. The method of claim 9, wherein applying the dead time compensation comprises at least one of modifying a reference voltage upon which control of the half bridge is based or modifying a pulse width modulation pattern according to which the half bridge is controlled.

11. A half bridge controller, comprising:
a measurement circuit configured to measure a switching delay of at least one of a high-side switch or a low-side switch of a half bridge, and
a control circuit configured to ascertain a polarity of a current through the half bridge based on the measured switching delay.

12. The half bridge controller of claim 11, wherein, for ascertaining the polarity of the current through the half bridge, the control circuit is configured to compare the measured switching delay with a threshold.

13. The half bridge controller of claim 11, wherein the measurement circuit is configured to measure the switching delay of the at least one of the high-side switch or the low-side switch of the half bridge as a time difference between a nominal switching time according to a control signal of the at least one of the high-side switch or the low-side switch and a time when a voltage across the at least one of the high-side switch or the low-side switch crosses a predefined threshold voltage.

14. The half bridge controller of claim 13, wherein the measurement circuit comprises a comparator, wherein a first input of the comparator is configured to receive the voltage across the at least one of the high-side switch or the low-side switch and a second input of the comparator is configured to receive the predefined threshold voltage.

15. The half bridge controller of claim 14, wherein the measurement circuit comprises a counter, wherein a first input of the counter is coupled to an output of the comparator, wherein a second input of the counter is configured to receive the control signal, and wherein the counter is configured to start counting based on a first signal at one of the first input or the second input and to stop counting based on a second signal at the other one of the first input or the second input.

16. The half bridge controller of claim 13, wherein the at least one of the high-side switch or the low-side switch is a transistor switch, and the predefined threshold voltage is a threshold voltage of the transistor switch.

17. The half bridge controller of claim 13, wherein the at least one of the high-side switch or the low-side switch is a transistor switch, and wherein the voltage across the at least one of the high-side switch or the low-side switch comprises at least one of a voltage between load terminals of the transistor switch or a voltage between a control terminal and a load terminal of the transistor switch.

18. The half bridge controller of claim 11, further comprising:
   a prediction circuit configured to predict a phase angle for a plurality of half bridges, and
   a multiplexer configured to select the half bridge for measuring the switching delay from the plurality of half bridges based on the phase angle.

19. The half bridge controller of claim 11, wherein the control circuit is further configured to apply a dead time compensation based on the polarity of the current through the half bridge.

20. A system, comprising:
   a half bridge circuit comprising a high-side switch and a low-side switch; and
   a half bridge controller coupled to the high-side switch via a first control signal line, and to the low-side switch via a second control signal line, the half bridge controller comprising:
      a comparator having a first input configured to receive a body voltage of the high-side switch or the low-side switch, and a second input configured to receive a threshold voltage;
      a counter having a first input coupled to an output of the comparator, and a first input coupled to the first control signal line or the second control signal line; and
      a control circuit having an input coupled to an output of the counter, the control circuit configured to determine a polarity of a current through the half bridge circuit based on a time delay value provided at the output of the counter.

* * * * *

UNITED STATES PATENT AND TRADEMARK OFFICE
CERTIFICATE OF CORRECTION

Page 1 of 1

PATENT NO. : 11,159,098 B2
APPLICATION NO. : 16/841066
DATED : October 26, 2021
INVENTOR(S) : Li It is certified that error appears in the above-identified patent and that said Letters Patent is hereby corrected as shown below:

On the Title Page

Item (30), Foreign Application Priority Data; delete "(WO)" and insert --(CN)--.

In the Claims

In Claim 1, Column 14, Line 5; delete "A method for determining ascertaining" and insert --A method for ascertaining--.

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*